US012112972B2

(12) United States Patent
Liang et al.

(10) Patent No.: US 12,112,972 B2
(45) Date of Patent: Oct. 8, 2024

(54) ROTATING BIASABLE PEDESTAL AND ELECTROSTATIC CHUCK IN SEMICONDUCTOR PROCESS CHAMBER

(71) Applicant: Applied Materials, Inc., Santa Clara, CA (US)

(72) Inventors: Qiwei Liang, Fremont, CA (US); Douglas Arthur Buchberger, Jr., Livermore, CA (US); Gautam Pisharody, Newark, CA (US); Dmitry Lubomirsky, Cupertino, CA (US); Shekhar Athani, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 354 days.

(21) Appl. No.: 17/221,215

(22) Filed: Apr. 2, 2021

(65) Prior Publication Data

US 2022/0319896 A1 Oct. 6, 2022

(51) Int. Cl.
*H01L 21/687* (2006.01)
*C23C 16/455* (2006.01)
*C23C 16/458* (2006.01)
*C23C 16/46* (2006.01)
(Continued)

(52) U.S. Cl.
CPC .... *H01L 21/68785* (2013.01); *C23C 16/4584* (2013.01); *C23C 16/4586* (2013.01);
(Continued)

(58) Field of Classification Search
CPC .......... H01J 37/32091; H01J 37/32174; H01J 37/32183; H01J 37/32431; H01J 37/3244;
(Continued)

(56) References Cited

U.S. PATENT DOCUMENTS 5,822,171 A * 10/1998 Shamouilian ....... C23C 16/4586
279/128
5,968,379 A * 10/1999 Zhao ................... C23C 16/4586
219/121.52
(Continued)

FOREIGN PATENT DOCUMENTS

CN 106158717 A 11/2016
KR 10-2020-0136109 A 12/2020

OTHER PUBLICATIONS

PCT International Search Report and Written Opinion for PCT/US2022/022922 dated Jul. 7, 2022.

*Primary Examiner* — Kurt Sweely
(74) *Attorney, Agent, or Firm* — Moser Taboa

(57) ABSTRACT

Embodiments of substrate supports are provided herein. In some embodiments, a substrate support for use in a chemical vapor deposition (CVD) chamber includes: a pedestal to support a substrate, wherein the pedestal includes a dielectric plate coupled to a pedestal body; a rotary union coupled to the pedestal, wherein the rotary union includes a stationary housing disposed about a rotor; a drive assembly coupled to the rotary union; a coolant union coupled to the rotary union and having a coolant inlet fluidly coupled to coolant channels disposed in the pedestal via a coolant line; an RF rotary joint coupled to the coolant union and having an RF connector configured to couple the pedestal to an RF bias power source; and an RF conduit that extends from the RF connector to the pedestal through a central opening of the pedestal body to provide RF bias to the pedestal.

18 Claims, 5 Drawing Sheets

(51) Int. Cl.
*C23C 16/505* (2006.01)
*H01J 37/32* (2006.01)
*H01L 21/683* (2006.01)

(52) U.S. Cl.
CPC .......... *C23C 16/463* (2013.01); *C23C 16/505* (2013.01); *H01J 37/32091* (2013.01); *H01J 37/32724* (2013.01); *H01J 37/32899* (2013.01); *H01L 21/6833* (2013.01); *H01L 21/68792* (2013.01); *C23C 16/45565* (2013.01); *H01J 37/32183* (2013.01); *H01J 37/32568* (2013.01); *H01J 37/32642* (2013.01); *H01J 37/32706* (2013.01)

(58) Field of Classification Search
CPC .......... H01J 37/32449; H01J 37/32458; H01J 37/32522; H01J 37/32532; H01J 37/32568; H01J 37/32577; H01J 37/32633; H01J 37/32642; H01J 37/32697; H01J 37/32706; H01J 37/32715; H01J 37/32724; H01J 37/32834; H01J 37/32889; H01J 37/32899; C23C 16/45561; C23C 16/45565; C23C 16/45591; C23C 16/4584; C23C 16/4586; C23C 16/46; C23C 16/463; C23C 16/466; C23C 16/505; C23C 16/509; C23C 16/5093; H01L 21/68742; H01L 21/6875; H01L 21/68764; H01L 21/68785; H01L 21/68792; H01L 21/6833; C30B 25/12
See application file for complete search history.

(56) References Cited

U.S. PATENT DOCUMENTS

| | | | | |
|---|---|---|---|---|
| 6,081,414 | A * | 6/2000 | Flanigan | H01J 37/32532 |
| | | | | 279/128 |
| 6,689,221 | B2 * | 2/2004 | Ryding | C23C 14/505 |
| | | | | 118/724 |
| 8,206,552 | B2 * | 6/2012 | Chen | H01J 37/32091 |
| | | | | 118/728 |
| 8,884,524 | B2 * | 11/2014 | Zhou | H01J 37/32577 |
| | | | | 315/39 |
| 10,704,693 | B2 * | 7/2020 | Mitchell | F16L 39/04 |
| 2002/0142593 | A1 | 10/2002 | Langley et al. | |
| 2004/0027781 | A1 * | 2/2004 | Hanawa | H01J 37/32706 |
| | | | | 361/234 |
| 2006/0005930 | A1 * | 1/2006 | Ikeda | H01L 21/6831 |
| | | | | 156/345.51 |
| 2008/0008842 | A1 * | 1/2008 | Soo | H01J 37/32165 |
| | | | | 427/576 |
| 2013/0287529 | A1 * | 10/2013 | Yang | H01L 21/68742 |
| | | | | 269/14 |
| 2014/0263275 | A1 * | 9/2014 | Nguyen | G01K 13/08 |
| | | | | 374/179 |
| 2015/0170952 | A1 | 6/2015 | Subramani et al. | |
| 2017/0125274 | A1 | 5/2017 | Swaminathan et al. | |
| 2018/0005857 | A1 | 1/2018 | Zhang et al. | |
| 2018/0174880 | A1 | 6/2018 | Swaminathan et al. | |
| 2018/0308669 | A1 * | 10/2018 | Bokka | H01L 21/67103 |
| 2019/0181028 | A1 * | 6/2019 | Patel | H01L 21/68785 |
| 2020/0135434 | A1 * | 4/2020 | Nakagawasai | H01L 21/67109 |

* cited by examiner

ROTATING BIASABLE PEDESTAL AND ELECTROSTATIC CHUCK IN SEMICONDUCTOR PROCESS CHAMBER

FIELD

Embodiments of the present disclosure generally relate to substrate processing equipment.

BACKGROUND

Substrate processing systems typically include process chambers for performing a desired process, such as a deposition process, on one or more substrates disposed therein. Chemical vapor deposition (CVD) process chambers are often used in the semiconductor industry to deposit thin films onto substrates supported by substrate supports disposed in the CVD process chambers. CVD process chambers may employ plasma techniques to perform gap fill processes with flowable CVD. However, achieving high quality film in CVD gap fill processes is difficult when feature sizes in the substrate become smaller.

Accordingly, the inventors have provided embodiments of improved substrate supports for use in CVD chambers.

SUMMARY

Embodiments of substrate supports are provided herein. In some embodiments, a substrate support for use in a chemical vapor deposition (CVD) chamber includes: a pedestal to support a substrate, wherein the pedestal includes a dielectric plate coupled to a pedestal body; a rotary union coupled to the pedestal, wherein the rotary union includes a stationary housing disposed about a rotor; a drive assembly coupled to the rotary union and configured to rotate the rotor to rotate the pedestal; a coolant union coupled to the rotary union and having a coolant inlet fluidly coupled to coolant channels disposed in the pedestal via a coolant line; an RF rotary joint coupled to the coolant union and having an RF connector configured to couple the pedestal to an RF bias power source; and an RF conduit that extends from the RF connector to the pedestal through a central opening of the pedestal body to provide RF bias to the pedestal.

In some embodiments, a substrate support for use in a chemical vapor deposition (CVD) chamber includes: a pedestal to support a substrate, wherein the pedestal includes a dielectric plate coupled to a pedestal body, wherein the pedestal comprises a monopolar electrode or bipolar electrodes; a rotary union coupled to the pedestal, wherein the rotary union includes a stationary housing disposed about a rotor; a drive assembly coupled to the rotary union and configured to rotate the rotor to rotate the pedestal; a coolant union coupled to the rotary union and having a coolant inlet fluidly coupled to coolant channels disposed in the pedestal via a coolant line; an RF rotary joint coupled to the coolant union and having an RF connector configured to couple the pedestal to an RF bias power source; an RF conduit that extends from the RF connector to the pedestal through a central opening of the pedestal body; a bellows assembly disposed about the pedestal body; and a lift assembly coupled to bellows assembly and configured to selectively raise or lower the pedestal.

In some embodiments, a chemical vapor deposition (CVD) process chamber includes: a chamber body defining an interior volume therein; a showerhead disposed in the interior volume for supplying one or more process gases into the interior volume; a substrate support disposed in the interior volume opposite the showerhead, wherein the substrate support comprises: a pedestal to support a substrate, wherein the pedestal includes a dielectric plate coupled to a pedestal body; a rotary union coupled to the pedestal, wherein the rotary union includes a stationary housing disposed about a rotor; a drive assembly coupled to the rotary union and configured to rotate the rotor to rotate the pedestal; a coolant union coupled to the rotary union and having a coolant inlet fluidly coupled to coolant channels disposed in the pedestal via a coolant line; an RF rotary joint coupled to the coolant union and having an RF connector; and an RF conduit that extends from the RF connector to the pedestal through a central opening of the pedestal body; and an RF bias power source coupled to the RF conduit and configured to provide RF power to the dielectric plate via the RF conduit.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
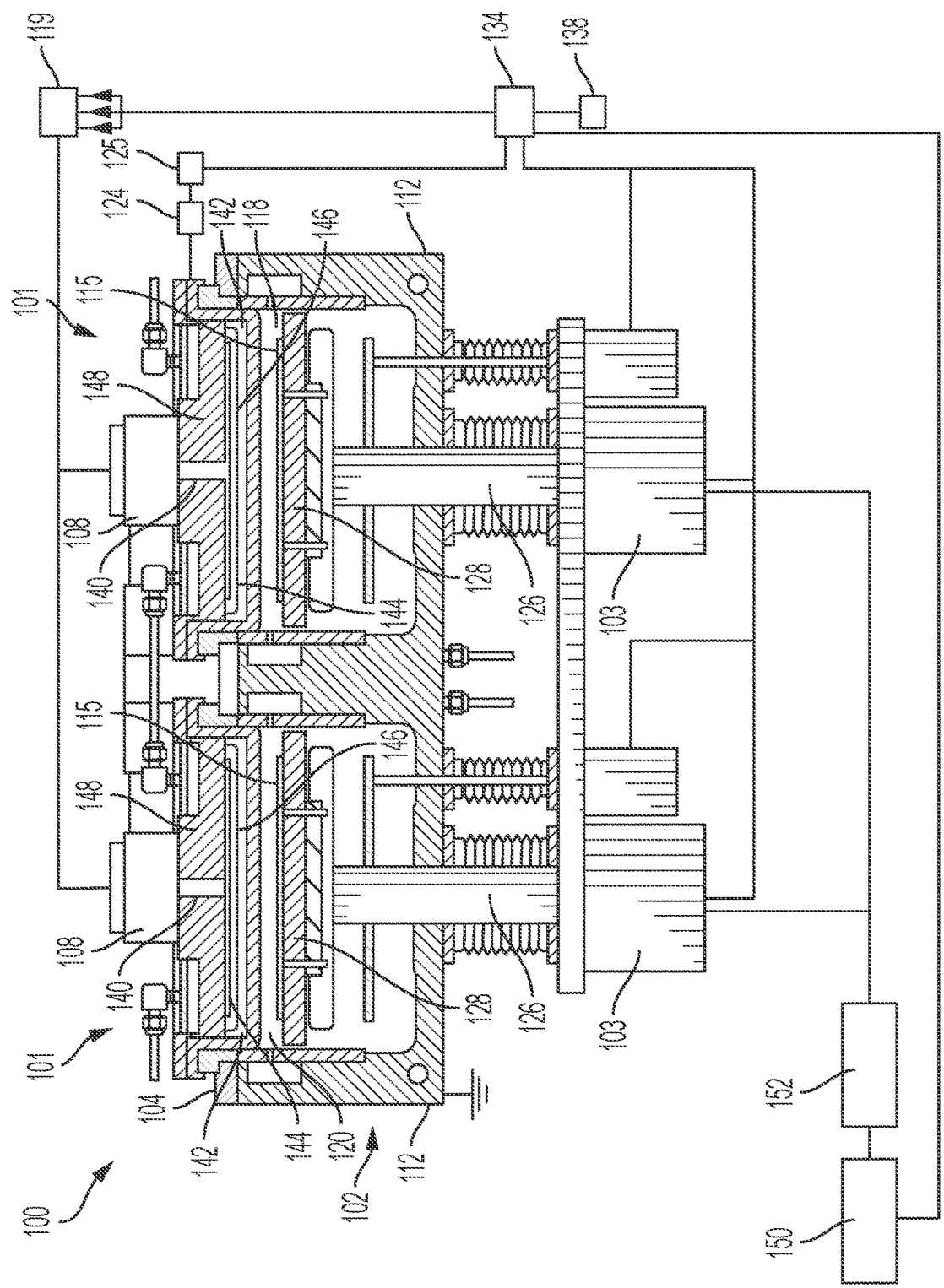
FIG. 1 depicts a cross-sectional schematic view of an apparatus for depositing films in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports are provided herein. The substrate supports provided herein advantageously include rotating biasable pedestals for use in CVD process chambers. The combination of the rotating features and the biasing features of the pedestals provide enhanced gap fill for high aspect ratio features, gap fill uniformity, and high-density film quality. The substrate supports include radio frequency (RF) rotary joints configured to supply continuous wave or pulsed RF bias power to the pedestal.

FIG. 1 depicts a cross-sectional schematic view of an apparatus 100 for depositing films in accordance with at least some embodiments of the present disclosure. The apparatus 100 generally includes a chemical vapor deposition (CVD) chamber 101 for depositing layers according to embodiments of the present disclosure. In some embodiments, as shown in FIG. 1, the apparatus 100 may comprise a dual or twin chamber configuration having two CVD chambers 101. In some embodiments, the twin chamber has two isolated interior volumes (for processing two substrates, one substrate per processing region) such that the flow rates experienced in each region are approximately one half of the flow rates into the apparatus 100. In some embodiments, the apparatus 100 is standalone. In some embodiments, the apparatus 100 is part of a multi-chamber processing tool.

The apparatus 100 has a chamber body 102 that defines separate interior volumes 118, 120. Each of the interior volumes 118, 120 has a substrate support 128 disposed therein for supporting a substrate 115 within the CVD chamber 101. In some embodiments, the substrate support 128 includes a heating element (not shown). Preferably, each substrate support 128 is movably disposed in one of the interior volumes 118, 120 by a support shaft 126 which extends through the bottom of the chamber body 102 where the support shaft 126 is connected to a lift assembly 103.

The interior volumes 118, 120 also generally includes a gas distribution assembly 108 disposed through a chamber lid 104 to deliver gases into the interior volumes 118, 120. In some embodiments, the gas distribution assembly 108 of each processing region includes a gas inlet passage 140 which delivers gas from a gas flow controller 119 into a showerhead 142. The gas flow controller 119 is typically used to control and regulate the flow rates of different process gases into the CVD chamber 101. Other flow control components may include a liquid flow injection valve and liquid flow controller (not shown) if liquid precursors are used. In some embodiments, the showerhead 142 comprises an annular base plate 148, a face plate 146, and a blocker plate 144 between the annular base plate 148 and the face plate 146. The showerhead 142 includes a plurality of openings (not shown) through which gaseous mixtures are injected during processing.

An RF (radio frequency) power supply 125 provides a bias potential to the showerhead 142 to facilitate generation of a plasma between the showerhead assembly and the substrate support 128. In some embodiments, the RF power supply 125 is coupled to the showerhead 142 via an RF match network 124. During a plasma-enhanced chemical vapor deposition process, the substrate support 128 may serve as a cathode for generating the RF bias within the chamber body 102. The substrate support 128 is advantageously electrically coupled to a bias power supply 150 to generate a bias voltage on the substrate 115 in the CVD chamber 101. Typically, an RF voltage is applied to the cathode while the chamber body 102 is electrically grounded. Power applied to the substrate support 128 creates a substrate bias in the form of a negative voltage on the upper surface of the substrate 115. The negative voltage is used to attract ions from the plasma formed in the CVD chamber 101 to the upper surface of the substrate 115. In some embodiments, the bias power supply 150 is coupled to the substrate support 128 via an RF match network 152.

During processing, process gases are distributed radially across the substrate surface to perform gap fill processes. The plasma is formed from one or more process gases or a gas mixture by applying RF energy from the RF power supply 125 to the showerhead 142, which acts as a powered electrode. Film deposition takes place when the substrate 115 is exposed to the plasma and the reactive gases provided therein. The chamber walls 112 are typically grounded. The RF power supply 125 can supply either a single or mixed-frequency RF signal to the showerhead 142 to enhance the decomposition of any gases introduced into the interior volumes 118, 120.

A system controller 134 controls the functions of various components such as the RF power supply 125, the bias power supply 150, the lift assembly 103, the gas flow controller 119, and other associated chamber and/or processing functions. The system controller 134 executes system control software stored in a memory 138, which in the preferred embodiment is a hard disk drive and can include analog and digital input/output boards, interface boards, and stepper motor controller boards. Optical and/or magnetic sensors are generally used to move and determine the position of movable mechanical assemblies. The above CVD chamber 101 description is mainly for illustrative purposes, and other plasma processing chambers may also be employed for practicing embodiments of the invention.

During deposition on the substrate 115, a controlled plasma is typically formed in the chamber adjacent to the substrate 115 by RF energy applied to the showerhead using the RF power supply 125 as depicted in FIG. 1 Alternatively, or additionally, RF power can be provided to the substrate support 128. The plasma may be generated using high frequency RF (HFRF) power, as well as low frequency RF (LFRF) power (e.g., dual frequency RF), constant RF, pulsed RF, or any other suitable plasma generation technique. The RF power supply 125 can supply a single frequency RF between about 1 MHz and about 300 MHz. In addition, the RF power supply 125 may also supply a single frequency LFRF between about 300 Hz and about 1,000 kHz to supply a mixed frequency to enhance the decomposition of reactive species of the process gas introduced into the process chamber. The RF power may be cycled or pulsed to reduce heating of the substrate and promote greater porosity in the deposited film. Suitable RF power may be a power in a range between about 10 W and about 5,000 W, preferably in a range between about 200 W and about 3,000 W. Suitable LFRF power may be a power in a range between about 0 W and about 5,000 W, preferably in a range between about 0 W and about 500 W.

During deposition, the bias power supply 150 may be configured to supply about 1 kW to about 3 kW of power. In some embodiments, the bias power supply 150 is configured to supply bias power at a single frequency RF of about 0.5 MHz to about 30 MHz, for example, the frequency range can be from about 0.5 MHz to about 15 MHz. In some embodiments, the bias power supply 150 is configured to supply bias power at multiple RF frequencies. In some embodiments, during deposition, the substrate 115 may be maintained at a temperature between about −20° C. and about 100° C.

Figure 2:
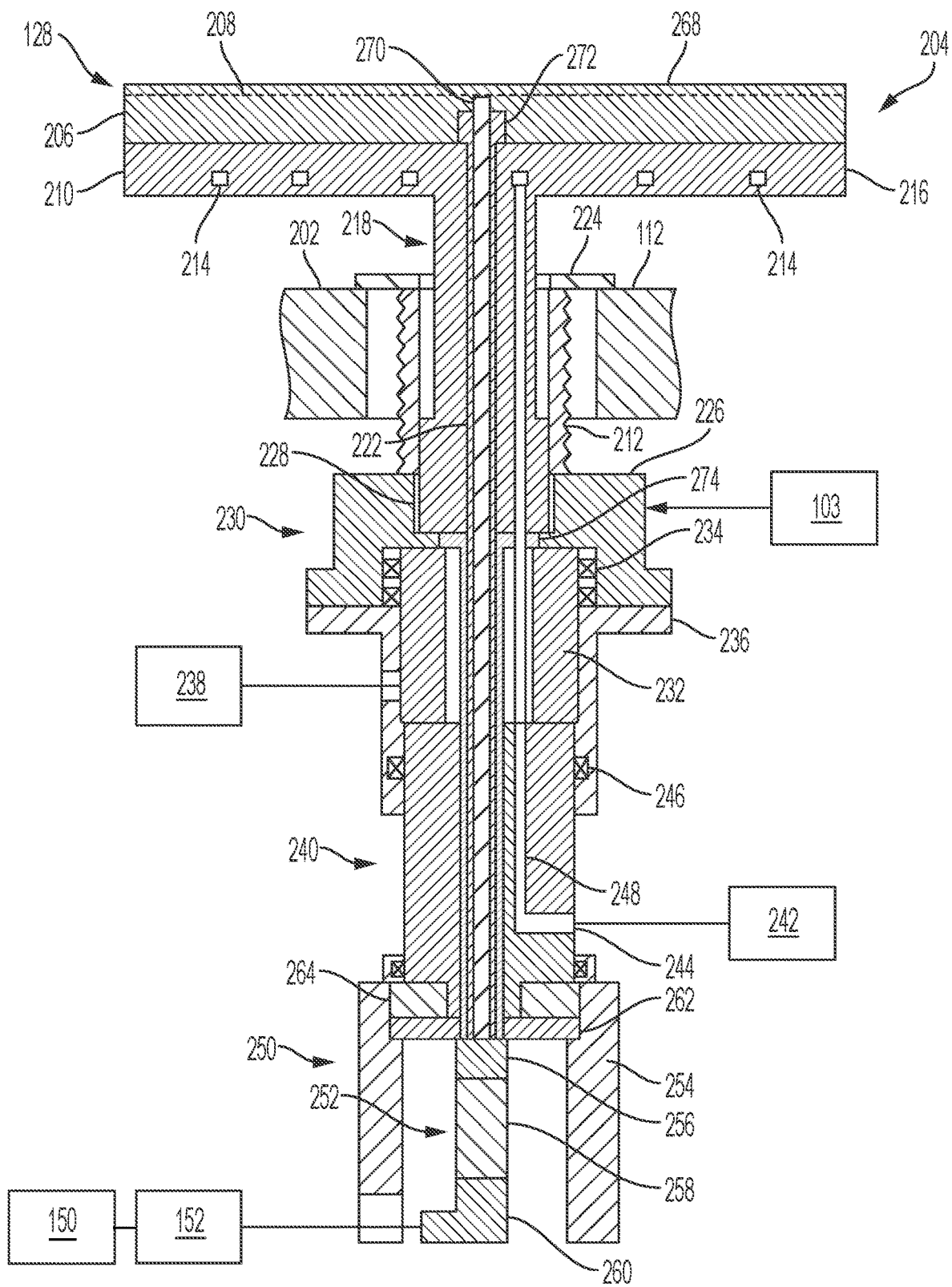
FIG. 2 depicts a cross-sectional schematic view of a substrate support in accordance with at least some embodiments of the present disclosure.
Figure 3:
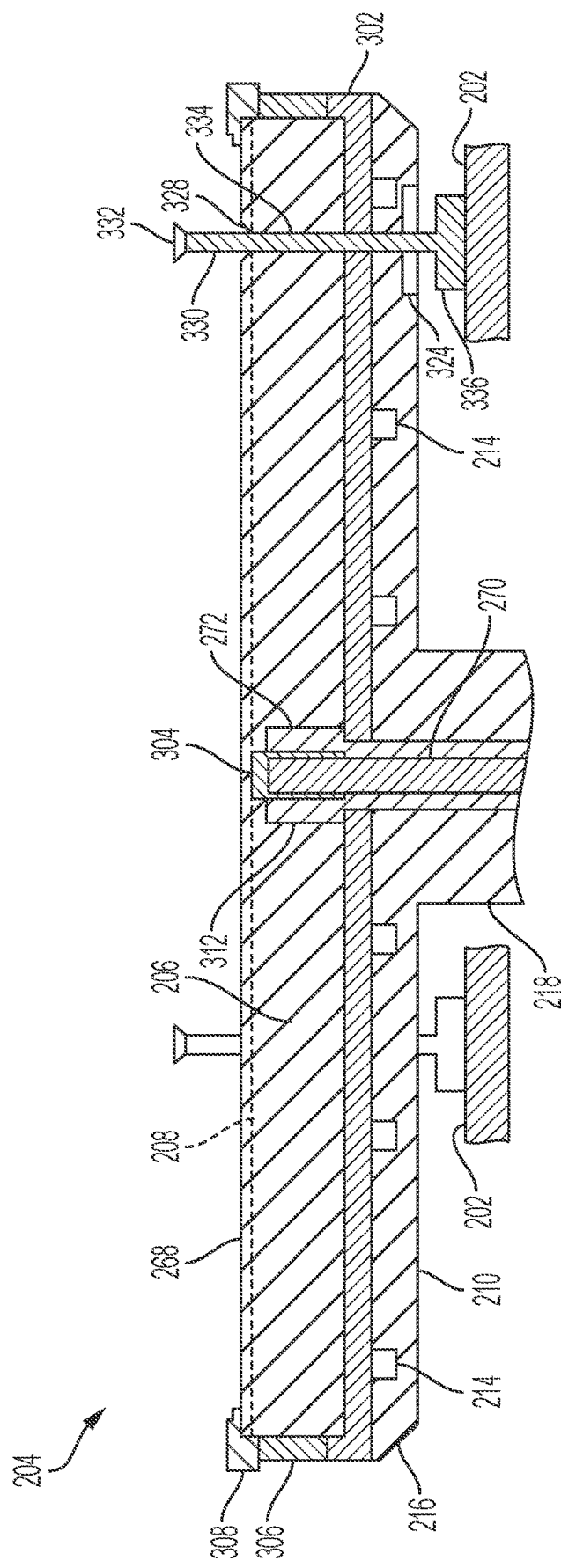
FIG. 3 depicts a cross-sectional view of a pedestal of a substrate support in accordance with at least some embodiments of the present disclosure.

FIG. 2 depicts a cross-sectional schematic view of a substrate support 128 in accordance with at least some embodiments of the present disclosure. The substrate support 128 includes a pedestal 204 having a support surface 268 to support the substrate 115. The pedestal 204 generally includes a dielectric plate 206 coupled to a pedestal body 210. In some embodiments, as shown in FIGS. 2 and 3, the pedestal 204 comprises a monopolar electrode 208 disposed in the dielectric plate 206. The pedestal body 210 includes a ground plate 216 coupled to a stem 218. In some embodiments, the ground plate 216 includes a plurality of coolant channels 214 for flowing a coolant therethrough. The coolant may be any suitable coolant such as water, glycol, polyether fluids, or the like. The pedestal body 210 includes a central opening 222 that extends through the ground plate 216 and the stem 218. The stem 218 provides a conduit to provide, for example, backside gases, fluids, coolants, power, or the like to the rest of the pedestal 204.

In some embodiments, a bellows assembly 212 is disposed about the pedestal body 210. For example, the bellows assembly 212 may be disposed about the stem 218 and disposed through a floor 202 of the chamber walls 112. The bellows assembly 212 may include an upper flange 224 coupled to the floor 202 to provide a flexible seal that allows vertical portion of the pedestal 204 while preventing loss of vacuum from within the CVD chamber 101. A lift assembly, for example, the lift assembly 103 is coupled to the bellows assembly 212 and configured to selectively raise or lower the pedestal 204 in the interior volumes 118, 120 between processing positions (as shown in FIG. 1) and lower, transfer positions (not shown).

A rotary union 230 is coupled to the pedestal 204 and configured to facilitate rotating the pedestal 204. The rotary union 230 generally includes a stationary housing 226 disposed about a rotor 232. The rotor 232 is coupled to the pedestal 204 such that the pedestal 204 rotates with the rotor 232. The rotor 232 may rotate with respect to the stationary housing 226 using any suitable means. For example, one or more first bearings 234 may be disposed therebetween the rotor 232 and the stationary housing 226 to facilitate rotation therebetween. In some embodiments, the lift assembly 103 is coupled to the stationary housing 226 and configured to raise or lower the rotary union 230 with respect to the floor 202 to raise or lower the pedestal 204. In some embodiments, the stationary housing 226 includes a central opening 228. In some embodiments, the stem 218 extends at least partially through the central opening 228.

In some embodiments, the rotary union 230 includes a second stationary housing 236 disposed about a lower portion of the rotor 232. In some embodiments, the second stationary housing 236 is coupled to a lower portion of the stationary housing 226. The one or more first bearings 234 may be disposed between the stationary housing 226 and the rotor 232, the second stationary housing 236 and the rotor 232, or both.

A drive assembly 238 is coupled to the rotary union 230 and configured to rotate the rotor 232 via any suitable means to rotate the pedestal 204. For example, the drive assembly 238 may include a motor coupled to one or more belts, pulleys, tracks, or gears. In some embodiments, the drive assembly 238 is configured to rotate the pedestal 204 at a rotation speed of about 10 revolutions per minute or less. In some embodiments, the drive assembly 238 is coupled to the rotor 232 through an opening in the second stationary housing 236. In some embodiments, the drive assembly 238 is coupled to the rotor 232 through an opening in the stationary housing 226 or a gap between the stationary housing 226 and the second stationary housing 236.

A coolant union 240 is coupled to the rotary union 230 and rotates with the rotary union 230. The coolant union 240 includes a coolant inlet 244 inlet fluidly coupled to the coolant channels 214 of the pedestal 204. For example, a coolant line 248 may extend from the coolant inlet 244 through the coolant union 240, through the rotor 232, and through the stem 218, to the coolant channels 214. A coolant supply 242 may be coupled to the coolant inlet 244 to flow a coolant, such as any of the coolants mentioned above, through the coolant channels 214 to control a temperature of the pedestal 204. A coolant return line (not shown) may extend from the coolant channels 214 back to the coolant union 240. In some embodiments, an upper portion of the coolant union 240 is disposed within a portion of the second stationary housing 236 of the rotary union 230. In some embodiments, one or more second bearings 246 are disposed between the coolant union 240 and the second stationary housing 236 to facilitate rotational movement therebetween.

An RF rotary joint 250 is coupled to the coolant union 240 and configured to couple the bias power supply 150 to the pedestal 204. In some embodiments, the RF rotary joint 250 generally includes an RF housing 254 and an RF connector 252 disposed in the RF housing 254. In some embodiments, the RF connector 252 includes an upper portion 256 and a lower portion 258 such that the lower portion 258 is configured to rotate with respect to the upper portion 256 via suitable means such as via one or more bearings disposed therebetween. In some embodiments, the upper portion 256 and the lower portion 258 are a single component. In some embodiments, the upper portion 256 and the lower portion 258 include features to facilitate quick connect or disconnect therebetween. In some embodiments, an RF elbow connector 260 is coupled to the lower portion 258 at one end and the bias power supply at an opposite end. In some embodiments, the RF connector 252 is configured to provide a single channel RF connection. In some embodiments, the RF connector 252 is configured to provide about 0.8 kW to about 1.2 kW of RF power at a frequency of about 0.5 MHz to about 15 MHz.

In some embodiments, a lower portion of the coolant union 240 extends into the RF housing 254. In some embodiments, the RF rotary joint 250 includes an insulated adapter ring 264 disposed about the lower portion of the coolant union 240. In some embodiments, the RF rotary joint 250 includes a mounting ring 262 coupled to the insulated adapter ring 264. The RF connector 252 may be mounted to the mounting ring 262 to couple the RF connector 252 to the coolant union 240.

An RF conduit 270 extends from the RF connector 252 to the pedestal 204 through the central opening 222 of the pedestal body 210 to provide RF bias power to the pedestal 204. The RF conduit 270 rotates with the pedestal 402. In some embodiments, the RF conduit 270 extends from the mounting ring 262 to the monopolar electrode 208 in the dielectric plate 206. In some embodiments, the RF conduit 270 is a metal rod that extends through the coolant union 240 and the rotary union 230. In some embodiments, the metal rod is made of brass. In some embodiments, the metal rod is silver plated. In some embodiments, the RF conduit 270 is centrally located in the substrate support 128. In some embodiments, the coolant line 248 (and coolant return line) is disposed radially outward of the RF conduit 270.

In some embodiments, an insulator tube 272 is disposed about the RF conduit 270 to insulate the RF conduit 270. In some embodiments, the insulator tube 272 is made of a polymer material, such as polytetrafluoroethylene (PTFE). In some embodiments, the insulator tube 272 extends from the mounting ring 262 to the dielectric plate 206.

In some embodiments, a ground tube 274 is disposed about at least a portion of the insulative tube 272 and coupled to ground to facilitate grounding of the pedestal body 210. In some embodiments, the ground tube 274 extends from the RF connector 252 to the pedestal body 210. In some embodiments, the ground tube 274 includes a tubular portion and an upper flange that extends radially outward from the tubular portion. In some embodiments, the upper flange of the ground tube 274 is disposed between the pedestal body 210 and the rotor 232. In some embodiments, the upper flange of the ground tube 274 includes one or more openings corresponding with the coolant line 248 (and coolant return line). In some embodiments, the ground tube 274 is made of aluminum. In some embodiments, the ground tube 274 is coated with nickel.

FIG. 3 depicts a cross-sectional view of a pedestal 204 of a substrate support 128 in accordance with at least some embodiments of the present disclosure. In some embodiments, the pedestal 204 includes an insulator plate 302 disposed between the dielectric plate 206 and ground plate 216 of the pedestal body 210 to insulate the dielectric plate 206 which is RF hot from the ground plate 216, which may be grounded. In some embodiments, the dielectric plate 206 is made of a ceramic material. In some embodiments, the dielectric plate 206 is made aluminum nitride (AlN). The monopolar electrode 208 may comprise a plate, a mesh, or the like. A rod connector 304 made of a metal is disposed between the RF conduit 270 and the monopolar electrode 208 and configured to electrically couple the RF conduit 270 to the monopolar electrode 208. In some embodiments, the rod connector 304 has a recess 312 to accommodate an upper end of the RF conduit 270. In some embodiments, the rod connector 304 has an inverted U-shaped cross-section. In some embodiments, walls formed by the recess 312 of the rod connector 304 are disposed between the RF conduit 270 and insulator tube 272.

In some embodiments, the pedestal 204 includes an upper edge ring 308 having an annular shape and disposed on an outer peripheral edge of the dielectric plate 206. The upper edge ring 308 is configured to surround the substrate 115 and help guide or direct a plasma proximate an edge of the substrate 115. The upper edge ring 308 may also help prevent damage to the dielectric plate 206 by shielding the dielectric plate 206 from plasma during use. In some embodiments, the upper edge ring 308 is made of a ceramic material, such as aluminum oxide.

In some embodiments, the pedestal 204 includes a lower edge ring 306 having an annular shape and disposed an outer sidewall of the dielectric plate 206. The lower edge ring 306 is configured to surround and shield the dielectric plate 206 from plasma during use. In some embodiments, the lower edge ring 306 is made of a ceramic material, such as aluminum oxide. In some embodiments, the lower edge ring 306 rests on the insulator plate 302 so that only the support surface 268 of the dielectric plate 206 is exposed to plasma.

In some embodiments, the pedestal 204 includes one or more lift pins 330 disposed therein to selectively raising or lowering the substrate 115 off of or onto the pedestal 204. For example, the one or more lift pins 330 extend through the ground plate 216 of the pedestal body 210 and the dielectric plate 206. In some embodiments, the one or more lift pins 330 include a wider upper portion 332, a wider lower portion 336, and a narrow central portion 334. In some embodiments, the dielectric plate 206 includes one or more recesses 328 corresponding with the wider upper portion 332 of the one or more lift pins 330 so that when in an upper processing position, the wider upper portion 332 extends entirely into the one or more recesses 328 so that the substrate 115 rests directly on the support surface 268. When the pedestal 204 is moved to a lower, transfer position (as shown in FIG. 3), the wider lower portion 336 of the one or more lift pins 330 push against the floor 202 of the CVD chamber 101, raising the wider upper portion 332 of the one or more lift pins 330 above the support surface 268. In some embodiments, a lower surface of the ground plate 216 includes one of more second recesses 324 corresponding with the wider lower portion 336. In some embodiments, the wider upper portion 332 has an outer diameter less than the wider lower portion 336.

Figure 4:
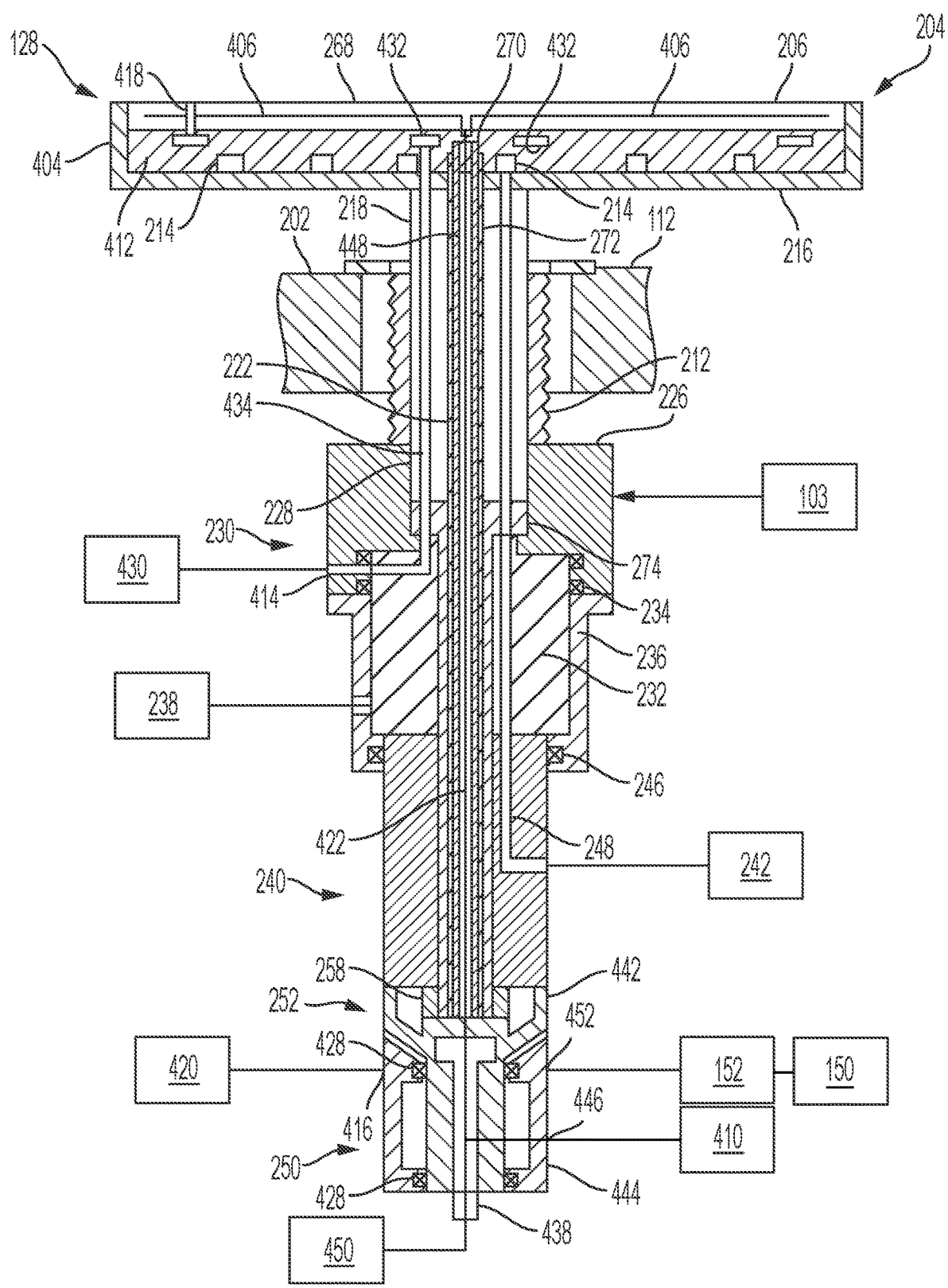
FIG. 4 depicts a cross-sectional schematic view of a substrate support in accordance with at least some embodiments of the present disclosure.

FIG. 4 depicts a cross-sectional schematic view of a substrate support in accordance with at least some embodiments of the present disclosure. In some embodiments, as shown in FIG. 4, the pedestal 204 includes an electrostatic chuck having bipolar electrodes, or one or more chucking electrodes 406, disposed in the dielectric plate 206 configured to electrostatically chuck the substrate 115. Cross-hatching of the dielectric plate 206 is not shown in FIG. 4 to aid in viewing the one or more chucking electrodes 406. The one or more chucking electrodes 406 are coupled to a DC power source 410 configured to provide DC power to the one or more chucking electrodes 406. In some embodiments, the dielectric plate 206 is made of aluminum oxide.

In some embodiments, the pedestal 204 includes a cooling plate 412 disposed between the dielectric plate 206 and the ground plate 216. The cooling plate 412 may be made of a metal such as aluminum. In some embodiments, the ground plate 216 includes an outer lip 404 that extends upward from the ground plate 216 at an outer peripheral edge of the ground plate 216 to surround the cooling plate 412. In some embodiments, the cooling plate 412, not the ground plate 216, includes the plurality of coolant channels 214 for flowing a coolant therethrough. In some embodiments, the coolant line 248 may extend from the coolant inlet 244 through the coolant union 240, through the rotor 232, through the stem 218, through the ground plate 216 and into the coolant channels 214. In some embodiments, the coolant line 248 extends through the ground tube 274. A coolant return line (not shown) may extend from the coolant channels 214 back to the coolant union 240.

In some embodiments, the RF rotary joint 250 is configured to provide about 0.5 kW to about 3 kW of RF power from the bias power supply 150 to the pedestal 204. In some embodiments, the RF rotary joint 250 is configured to provide three or more channels. In some embodiments, the RF conduit 270 comprises a metal tube with a central opening 448. The RF conduit 270 is coupled to the bias power supply 150 and comprises a first channel. In some embodiments, one or more electrical lines 422 extend through the central opening 448 of the metal tube from the RF rotary joint 250 to the one or more chucking electrodes 406. The one or more electrical lines 422 may include DC conduits 422A to provide DC power to the one or more chucking electrodes 406. The DC conduits 422A may comprise two conduits corresponding with the second and third channels. The two DC conduits 422A may be wires, cables, or the like. The one or more electrical lines 422 may also include a fiber optic cable 422B as discussed in more detail below for transmitting temperature readings at the one or more chucking electrodes 406.

In some embodiments, the RF rotary joint 250 includes an RF connector 252 having a stationary portion 444 and a rotating portion 442, the rotating portion 442 configured to rotate with the pedestal 204 and the RF conduit 270. One or more third bearings 428 may be disposed between the rotating portion 442 and the stationary portion 444 to facilitate rotation therebetween. In some embodiments, the bias power supply 150 is coupled to an RF input 452 in the stationary portion 444. In some embodiments, the one or more third bearings 428 are configured to couple RF bias power from the RF input 452 to the rotating portion 442 to the RF conduit 270 coupled to the rotating portion 442.

In some embodiments, the RF rotary joint 250 includes a purge gas inlet 416 fluidly coupled to the central opening 448 of the metal tube and configured to purge the central opening 448 with a purge gas to prevent moisture or contamination build up in the central opening 448. The purge gas inlet 416 may be coupled to a purge supply 420 having an inert gas such as nitrogen, argon, helium, or the like.

In some embodiments, the DC power source 410 may be coupled to a DC power input 446 in the stationary portion 444 of the RF rotary joint 250. In some embodiments, the DC power input 446, the purge gas inlet 416, and RF input 452 are arranged about the RF rotary joint 250 along a same horizontal plate. In some embodiments, the DC power input 446, the purge gas inlet 416, and RF input 452 are arranged about the RF rotary joint 250 along about 90-degree intervals. In some embodiments, the RF rotary joint 250 includes a fiber optic rotary joint 438. In such embodiments, an optic signal from the one or more chucking electrodes 406 is transmitted via the fiber optic cable 422B of the one or more electrical lines 422 to the fiber optic rotary joint 438 then to a receiver 450 configured to process the optic signal to determine a temperature reading of the one or more chucking electrodes 406.

In some embodiments, the substrate support 128 is configured to provide a backside gas to the support surface 268. In some embodiments, the rotary union 230 includes a backside gas inlet 414. In some embodiments, the substrate support 128 includes a backside gas line 434 that extends from the backside gas inlet 414 to the support surface 268, or upper surface, of the pedestal 204. The backside gas inlet 414 is coupled to a backside gas supply 430. In some embodiments, the backside gas supply 430 contains an inert gas, for example, helium, nitrogen, argon, or the like.

In some embodiments, backside gas inlet 414 is disposed on an outer sidewall of the stationary housing 226 of the rotary union 230. However, the backside gas inlet 414 may be disposed on any other suitable surface of the rotary union 230. In some embodiments, the backside gas line 434 extends radially inward from the stationary housing 226 to a location in the rotor 232, and then upward from the location in the rotor 232 to a top surface of the rotor 232, through the ground tube 274, through the stem 218, through the ground plate 216, into backside gas channels 432 disposed in the cooling plate 412. The backside gas channels 432 extend substantially horizontally through the cooling plate 412 in any suitable pattern. The backside gas line 434 includes a plurality of second backside gas channels 418 that extend upward from the backside gas channels 432 to the support surface 268 of the pedestal 204. In some embodiments, the backside gas channels 432 are disposed vertically above the coolant channels 214.

Figure 5:
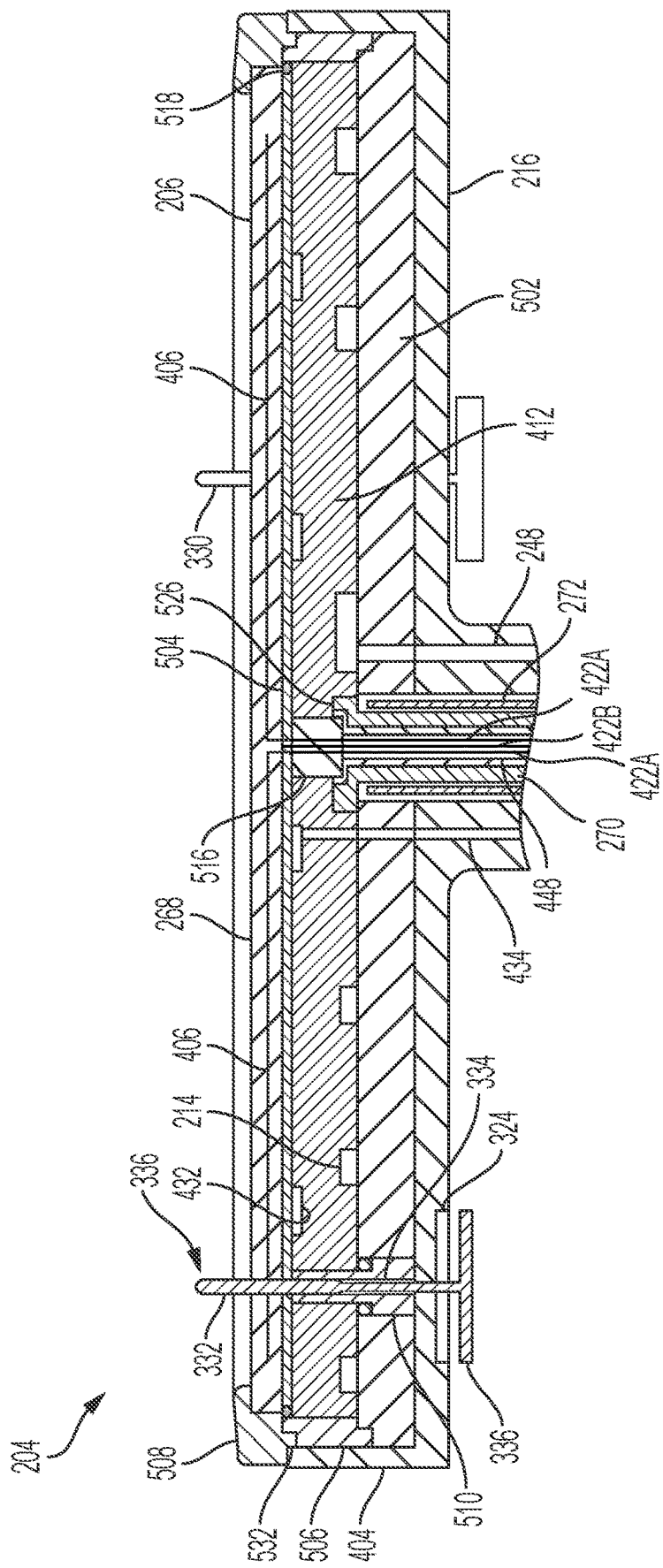
FIG. 5 depicts a cross-sectional view of a pedestal of a substrate support in accordance with at least some embodiments of the present disclosure.

FIG. 5 depicts a cross-sectional view of a pedestal 204 of a substrate support 128 in accordance with at least some embodiments of the present disclosure. In some embodiments, an insulator plate 502 is disposed between the cooling plate 412 and the ground plate 216 to insulate the ground plate 216 from the cooling plate 412 which is coupled to the bias power supply 150 via the RF conduit 270. In some embodiments, a bonding layer 504 is disposed between the dielectric plate 206 and the cooling plate 412. In some embodiments, a seal 518 is disposed between the dielectric plate 206 and the cooling plate 412 about the bonding layer 504.

In some embodiments, the RF conduit 270 includes an upper flange 526 that extends radially outward from the metal tube. In some embodiments, the upper flange 526 is disposed in the cooling plate 412. In some embodiments, an insulator plug 516 is disposed in the cooling plate 412 vertically above the RF conduit 270. In some embodiments, the DC conduits 422A extend from the central opening 448 of the RF conduit 270 through the insulator plug 516 to the one or more chucking electrodes 406. In some embodiments, a porous plug 510 is disposed in the insulator plate 502 and the cooling plate 412 about the one or more lift pins 330 to reduce or prevent arcing in the openings in the pedestal 204 for the one or more lift pins 330.

In some embodiments, the pedestal 204 includes an upper edge ring 508 having an annular shape and disposed on an outer peripheral edge of the dielectric plate 206. In some embodiments, the upper edge ring 508 functions similar to and is made of similar materials as the upper edge ring 308 discussed above with respect to FIG. 3. In some embodiments, the upper edge ring 508 includes a protrusion 532 on a bottom surface thereof.

In some embodiments, the pedestal 204 includes a lower edge ring 506 having an annular shape and disposed about an outer sidewall of the dielectric plate 206. The lower edge ring 506 is configured to surround the dielectric plate 206 and may advantageously reduce a chance of arcing between the dielectric plate 206 and the outer lip 404 of the ground plate 216. In some embodiments, the lower edge ring 506 is made of similar materials as the lower edge ring 306. In some embodiments, an upper surface of the lower edge ring 506 may include a recess to mate with the protrusion 532 of the upper edge ring 508.

While the foregoing is directed to embodiments of the present disclosure, other and further embodiments of the disclosure may be devised without departing from the basic scope thereof.

The invention claimed is:

1. A substrate support for use in a chemical vapor deposition (CVD) chamber, comprising:
    a pedestal to support a substrate, wherein the pedestal includes a dielectric plate coupled to a pedestal body;
    a rotary union coupled to the pedestal, wherein the rotary union includes a stationary housing disposed about a rotor;
    a drive assembly coupled to the rotary union and configured to rotate the rotor to rotate the pedestal;
    a coolant union coupled to the rotary union and having a coolant inlet fluidly coupled to coolant channels disposed in the pedestal via a coolant line;
    an RF rotary joint coupled to the coolant union and having a RF connector configured to couple the pedestal to an RF bias power source, wherein the RF connector includes an upper portion and a lower portion, the lower portion disposed below the upper portion and configured to rotate with respect to the upper portion;
    an RF conduit that extends from the RF connector to the pedestal through a central opening of the pedestal body to provide RF bias to the pedestal, wherein the RF conduit is disposed above the upper portion of the RF connector and in vertical alignment with the upper portion of the RF connector and the lower portion of the RF connector;
    an insulator tube disposed about the RF conduit, wherein portions of the insulator tube disposed in the dielectric plate is wider than portions of the insulator tube disposed in the pedestal body; and
    a ground tube disposed about the insulator tube and extending from the RF rotary joint to the rotary union, wherein the insulator tube extends vertically above an upper surface of the ground tube.

2. The substrate support of claim 1, wherein the dielectric plate includes a monopolar electrode and the RF conduit extends to the dielectric plate.

3. The substrate support of claim 1, wherein the RF conduit is a solid metal rod that extends through the coolant union and the rotary union.

4. The substrate support of claim 1, wherein the dielectric plate includes one or more chucking electrodes disposed in the dielectric plate.

5. The substrate support of claim 1, wherein the RF conduit comprises a metal tube with a central opening, and further comprising two DC conduits extending through the central opening of the metal tube from the RF rotary joint to the one or more chucking electrodes to provide DC power to the one or more chucking electrodes.

6. The substrate support of claim 1, wherein the rotary union includes a backside gas inlet, and the substrate support includes a backside gas line that extends from the backside gas inlet to an upper surface of the pedestal.

7. The substrate support of claim 1, further comprising a bellows assembly disposed about the pedestal body and a lift assembly coupled to bellows assembly and configured to selectively raise or lower the pedestal within a process chamber.

8. The substrate support of claim 1, further comprising one or more lift pins that extend through the pedestal and configured to raise the substrate from an upper surface of the pedestal.

9. A substrate support for use in a chemical vapor deposition (CVD) chamber, comprising:
   a pedestal to support a substrate, wherein the pedestal includes a dielectric plate coupled to a pedestal body, wherein the pedestal comprises a monopolar electrode or bipolar electrodes, wherein the pedestal further comprises an insulator plate disposed between the dielectric plate and the pedestal body, wherein the insulator plate substantially covers a lowermost surface of the dielectric plate;
   a rotary union coupled to the pedestal, wherein the rotary union includes a stationary housing disposed about a rotor;
   a drive assembly coupled to the rotary union and configured to rotate the rotor to rotate the pedestal;
   a coolant union coupled to the rotary union and having a coolant inlet fluidly coupled to coolant channels disposed in the pedestal via a coolant line;
   an RF rotary joint coupled to the coolant union and having an RF connector configured to couple the pedestal to an RF bias power source;
   an RF conduit that extends from the RF connector to the pedestal through a central opening of the pedestal body;
   an insulator tube disposed about the RF conduit to insulate the RF conduit, wherein the insulator plate extends radially inward to the insulator tube; and
   a ground tube disposed about the insulator tube and extending from the RF rotary joint towards the pedestal, wherein the insulator tube extends vertically above an upper surface of the ground tube.

10. The substrate support of claim 9, wherein a lower surface of the dielectric plate extends from an outer sidewall of the dielectric plate to the insulator tube, and wherein the insulator plate is in contact with an entire lower surface of the dielectric plate.

11. The substrate support of claim 9, wherein the RF conduit comprises a metal tube with a central opening and the RF rotary joint includes a purge gas inlet fluidly coupled to the central opening of the metal tube and configured to purge the central opening with a purge gas.

12. The substrate support of claim 9, wherein the RF rotary joint includes a fiber optic rotary joint.

13. A chemical vapor deposition (CVD) process chamber, comprising:
   a chamber body defining an interior volume therein;
   a showerhead disposed in the interior volume for supplying one or more process gases into the interior volume;
   a substrate support disposed in the interior volume opposite the showerhead, wherein the substrate support comprises:
      a pedestal to support a substrate, wherein the pedestal includes a dielectric plate coupled to a pedestal body;
      a rotary union coupled to the pedestal, wherein the rotary union includes a stationary housing disposed about a rotor;
      a drive assembly coupled to the rotary union and configured to rotate the rotor to rotate the pedestal;
      a coolant union coupled to the rotary union and having a coolant inlet fluidly coupled to coolant channels disposed in the pedestal via a coolant line;
      an RF rotary joint coupled to the coolant union, wherein the RF rotary joint includes an RF housing, an RF connector disposed in the RF housing, an insulated adapter ring disposed about a lower portion of the coolant union, and a mounting ring coupled to the RF connector and insulated adapter ring, wherein the RF connector includes an upper portion and a lower portion exposed to inner sidewalls of the RF housing, the lower portion configured to rotate with respect to the upper portion;
      an RF conduit that extends from the RF connector to the pedestal through a central opening of the pedestal body;
      an insulator tube disposed about the RF conduit, wherein portions of the insulator tube disposed in the dielectric plate is wider than portions of the insulator tube disposed in the pedestal body; and
      a ground tube disposed about the insulator tube and extending from the RF rotary joint to the rotary union, wherein the insulator tube extends vertically above an upper surface of the ground tube; and
   an RF bias power source coupled to the RF conduit and configured to provide RF power to an electrode disposed in the dielectric plate via the RF conduit.

14. The CVD process chamber of claim 13, wherein the electrode includes one or more chucking electrodes disposed in the dielectric plate, and further comprising a DC power source coupled to the one or more chucking electrodes to provide DC power to the one or more chucking electrodes.

15. The CVD process chamber of claim 13, further comprising a lift assembly coupled to the pedestal and configured to selectively raise or lower the pedestal within the interior volume.

16. The CVD process chamber of claim 13, wherein the RF rotary joint includes an RF elbow connector coupled to the lower portion within the RF housing.

17. The CVD process chamber of claim 13, wherein the coolant line is disposed radially outward of the RF conduit.

18. A twin CVD process chamber comprising two of the CVD process chambers of claim 13 having a single gas flow controller for supplying one or more process gases into each of the two CVD process chambers.

* * * * *